(12) United States Patent
Kim et al.

(10) Patent No.: US 8,222,131 B2
(45) Date of Patent: Jul. 17, 2012

(54) METHODS OF FORMING AN IMAGE SENSOR

(75) Inventors: Gi Bum Kim, Hwaseong-si (KR); Yun Ki Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 375 days.

(21) Appl. No.: 12/654,636

(22) Filed: Dec. 28, 2009

(65) Prior Publication Data

US 2010/0167453 A1    Jul. 1, 2010

(30) Foreign Application Priority Data

Dec. 26, 2008    (KR) .................. 10-2008-0134567

(51) Int. Cl.
*H01L 21/22* (2006.01)
(52) U.S. Cl. .................. 438/558; 438/72; 257/E21.144
(58) Field of Classification Search .................. 438/70, 438/72, 249, 392, 558, 567, 920; 257/E21.144, 257/E21.468
See application file for complete search history.

(56) References Cited

U.S. PATENT DOCUMENTS

| 7,919,796 B2 * | 4/2011 | Kim et al. .................. 257/292 |
| 2005/0144490 A1 | 6/2005 | Igari |
| 2006/0125038 A1 | 6/2006 | Mabuchi |

FOREIGN PATENT DOCUMENTS

| JP | 2006-173351 | 6/2006 |
| JP | 2008-066410 | 3/2008 |
| JP | 2008-103664 | 5/2008 |
| KR | 10-2006-0067872 | 6/2006 |

OTHER PUBLICATIONS

"Reaction of Co and capping layers and its effect on $CoSi_2$ formation in $Si/SiO_x/Co$ system", Gi Bum Kim et al., Applied Physics Letters, vol. 77, No. 10, pp. 1443-1445, Sep. 2000.

"Characteristics of diodes prepared using epitaxial $CoSi_2$ as a boron diffusion source", Gi Bum Kim et al, J. Vac. Sci. Technol. B, vol. 18, No. 5, pp. 2576-2578, Sep./Oct. 2000.

* cited by examiner

*Primary Examiner* — Quoc Hoang
(74) *Attorney, Agent, or Firm* — Harness, Dickey & Pierce, P.L.C.

(57) ABSTRACT

Provided is a method of forming an image sensor. The method may include providing a single crystalline semiconductor layer including at least one photodiode onto a support substrate; forming a material layer including dopants on the single crystalline semiconductor layer; and forming a dopant diffusion layer in the single crystalline semiconductor layer by diffusing the dopants of the material layer.

18 Claims, 3 Drawing Sheets

METHODS OF FORMING AN IMAGE SENSOR

CROSS-REFERENCE TO RELATED APPLICATIONS

This U.S. non-provisional patent application claims priority under 35 U.S.C. §119 to Korean Patent Application No. 10-2008-0134567, filed on Dec. 26, 2008, in the Korean Intellectual Property Office (KIPO), the entire contents of which are herein incorporated by reference.

BACKGROUND

1. Field

Example embodiments relate to methods of forming an image sensor, and more particularly, to methods of forming a back side illumination image sensor.

2. Description of the Related Art

Image sensors may convert a photo image into an electrical signal and are widely used in a digital camera, e.g., a cellular phone with a built-in camera. Image sensors may include a photoelectric conversion portion sensing a light, and converting the sensed light into an electrical signal and a logic circuit portion processing the electrical signal. A microlens may be near the photoelectric conversion portion so as to improve the efficiency of a light which is provided externally and reaches the photoelectric conversion portion. However, because an interconnection line is between the microlens and the photoelectric conversion portion, a light concentrated through the microlens does not effectively reach the photoelectric conversion portion.

SUMMARY

Example embodiments provide a method of forming an image sensor. The method may include providing a single crystalline semiconductor layer including at least one photodiode onto a support substrate; forming a material layer including dopants on the single crystalline semiconductor layer; and forming a dopant diffusion layer in the single crystalline semiconductor layer into the single crystalline semiconductor layer by diffusing the dopants of the material layer.

BRIEF DESCRIPTION OF THE FIGURES

The accompanying figures are included to illustrate and provide a further understanding of example embodiments, and are incorporated in and constitute a part of this specification. In the figures.

DETAILED DESCRIPTION OF EXAMPLE EMBODIMENTS

Figure 1:
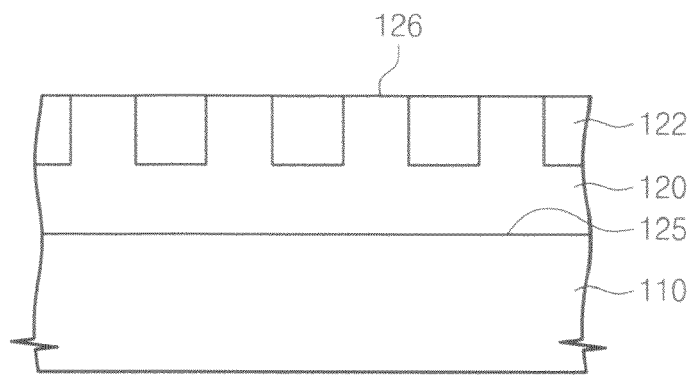
FIGS. 1 through 5 are drawings for illustrating a method of forming a image sensor according to example embodiments.

Example embodiments now will be described more fully hereinafter with reference to the accompanying drawings, in which example embodiments are shown. This invention may, however, be embodied in many different forms and should not be construed as limited to example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Example embodiments may be described with reference to cross-sectional illustrations, which are schematic illustrations of idealized example embodiments. As such, variations from the shapes of the illustrations, as a result, for example, of manufacturing techniques and/or tolerances, are to be expected. Thus, example embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Referring to FIGS. 1 through 6, a method of forming an image sensor according to example embodiments is described. Referring to FIG. 1, a semiconductor substrate 110 (hereinafter it is referred to as 'substrate') including a single crystalline semiconductor layer 120 is provided.

The single crystalline semiconductor layer 120 may be formed by an epitaxial growth process using the substrate 110 as a seed layer. Alternatively, the single crystalline semiconductor layer 120 may correspond to an upper portion of the substrate 110. The single crystalline semiconductor layer 120 may be doped with dopants of a first conductivity type. When the single crystalline semiconductor layer 120 is formed by the epitaxial growth process, the single crystalline semiconductor layer 120 may be doped by a in-situ method. Alternatively, when the single crystalline semiconductor layer 120 corresponds to an upper portion of the substrate 110, the single crystalline semiconductor layer 120 may be doped by an ion implantation process or a plasma doping process.

The first conductivity type may be a p-type or an n-type. For example, a conductivity type of dopants included in the single crystalline semiconductor layer 120 may be a p-type. The single crystalline semiconductor layer 120 may include a first side 125 adjacent to the substrate 110 and a second side 126 which is opposite the first side 125.

A separation layer (not shown) may be formed between the single crystalline semiconductor layer 120 and the substrate 110. The separation layer may be a hydrogen implantation layer or a porous semiconductor layer of a single crystalline state. The hydrogen implantation layer may be a layer into which hydrogen gas is implanted. The porous semiconductor layer may be a semiconductor layer having lower density than the single crystalline semiconductor layer 120. The porous semiconductor layer may have an etching selectivity with respect to the single crystalline semiconductor layer 120.

When the separation layer is formed of the porous semiconductor layer, the separation layer may be formed before forming the single crystalline semiconductor layer 120. For example, a porous process may be performed on a top surface of the substrate 110 to form a porous semiconductor layer of a single crystalline state on the substrate 110 and an epitaxial growth process using the porous semiconductor layer as a seed layer may be performed to form the single crystalline semiconductor layer 120. When the separation layer is formed of the hydrogen implantation layer, the separation layer may be formed before or after forming the single crystalline semiconductor layer 120. The hydrogen implantation layer may be formed by implanting hydrogen ions.

Dopants of a second conductivity type may be supplied to the single crystalline semiconductor layer 120 to form a photodiode 122. In example embodiments, the second conductivity type may be an n-type. A concentration of the dopants of the second conductivity type included in the photodiode 122 may be higher than a concentration of the dopants of the first conductivity type included in the single crystalline semiconductor layer 120. The photodiode 122 may function as a photodetector of an image sensor. The photodiode 122 may be formed by a different structure or a different method that may function as the photodetector.

Figure 2:
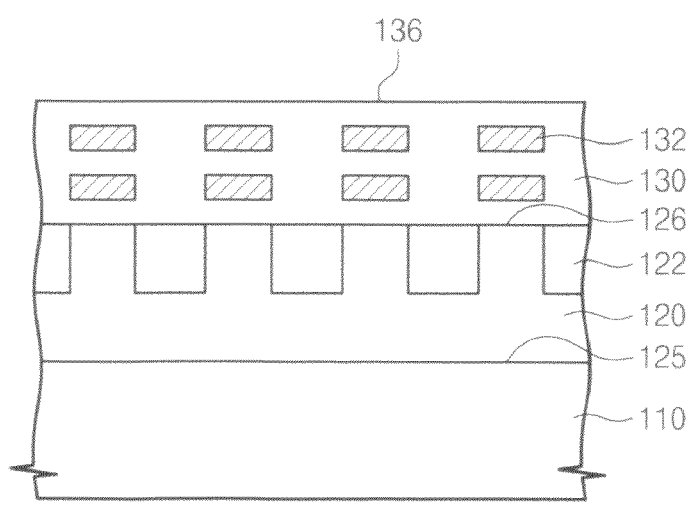

Referring to FIG. 2, an insulating layer 130 including at least one interconnection line 132 may be formed on the single crystalline semiconductor layer 120. The insulating layer 130 may be a multilayer. At least one of the interconnection lines 132 may be electrically connected to the photodiode 122 and/or a transistor. When a transistor is formed on and/or in the single crystalline semiconductor layer 120, the insulating layer 130 may be formed to cover the transistor.

Forming the insulating layer 130 and the interconnection lines 132 may include forming the insulating layer 130 on the single crystalline semiconductor layer 120, forming an interconnection layer on the insulating layer 130 and patterning the interconnection layer. Forming the insulating layer 130 and forming the interconnection line 132 may be repeatedly performed. Thus, the insulating layer 130 and the interconnection line 132 may be formed to be a multilayer. In example embodiments, the interconnection lines 132 formed in the insulating layer 130 may be electrically connected to each other by a contact (not shown) penetrating at least a portion of the insulating layer 130.

A planarization process may be further performed on the insulating layer 130 during and/or after a formation of the insulating layer 130. In example embodiments, the insulating layer 130 may be planarized after covering an uppermost interconnection line 132. The planarization may be performed until the interconnection lines 132 are not exposed. The insulating layer 130 formed on the uppermost interconnection line 132 may function as a passivation layer. The insulating layer 130 may include a first side 126 adjacent to the single crystalline semiconductor layer 120 and a second side 136 which is opposite the first side 126. The first side 126 may be a side that is in contact with the single crystalline semiconductor layer 120.

At least one transistor may further be formed on and/or in the single crystalline semiconductor layer 120 before the insulating layer 130 and the interconnection line 132 are formed. The transistor may be formed on and/or in the single crystalline semiconductor layer 120 and may be surrounded by the insulating layer 130. The transistor may include the photodiode 122. That is, the photodiode 122 may correspond to a source or a drain of the transistor. The transistor may be a transfer transistor for transferring an electrical signal generated from the photodiode 122.

The photodiode 122 and the transistor may be formed together by a series of processes. For example, the photodiode 122 and the transistor may be formed by forming a gate structure on the single crystalline semiconductor layer 120 and providing dopants of the second conductivity type to one side of the gate structure. A floating diffusion layer (not shown) may be formed on the other side of the gate structure which is opposite the photodiode 122. The floating diffusion layer may be doped with dopants of the second conductivity type. A depth of the floating diffusion layer may be smaller than that of the photodiode 122. The gate structure may include an insulating layer and a gate electrode laminated successively. Spacers (not shown) may be on both sidewalls of the gate structure.

Figure 3:
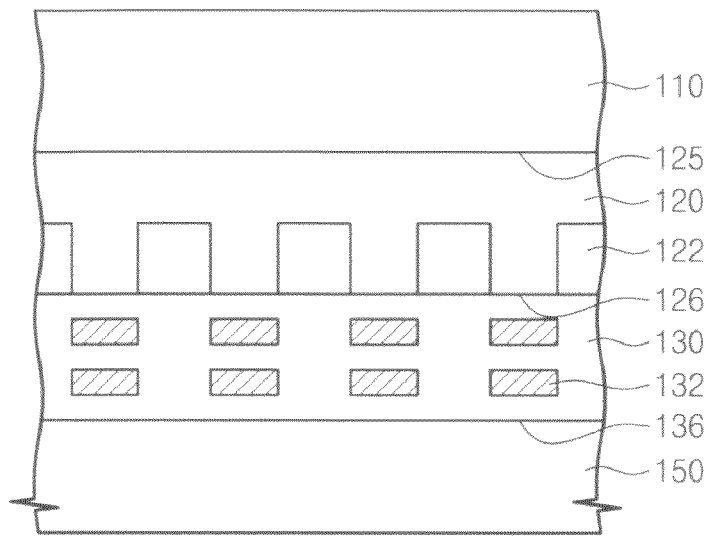

Referring to FIG. 3, the second side 136 of the insulating layer 130 may bond with a support substrate 150. As a result, a bonding structure is formed. The bonding structure may be reversed after it is formed. Thus, a position of the first side 126 of the insulating layer 130 may be exchanged with a position of the second side 136 of the insulating layer 130.

The substrate 110 may be removed from the bonding structure to expose the first side 125 of the single crystalline semiconductor layer 120. The substrate 110 may be removed by a grinding and/or a planarization process. When the porous semiconductor layer used as a separation layer is formed between the substrate 110 and the single crystalline semiconductor layer 120, the porous semiconductor layer may function as an etch stop layer. After removing the substrate 110, the porous semiconductor layer may be removed.

Alternatively, when the separation layer exists, an annealing process may be performed on the bonding structure to separate the substrate 110 on the separation layer from the bonding structure. When the separation layer is formed of the hydrogen implantation layer, bubbles in the hydrogen implantation layer may be connected to each other by the annealing process, thereby removing the substrate 110 from the bonding structure. When the separation layer is the porous semiconductor layer, the substrate 110 on the porous semiconductor layer may also be separated from the bonding structure by the annealing process.

After removing the substrate 110, an etching process may be further performed on the single crystalline semiconductor layer 120. The etching process may be performed to reduce a thickness of the single crystalline semiconductor layer 120. As the thickness of the single crystalline semiconductor layer 120 is reduced, a path of a light that reaches the photodiode 122 through the single crystalline semiconductor layer 120 may be reduced. Also, a surface damage of the first side 125 of the single crystalline semiconductor layer 120 may be removed. The surface damage may be caused when the substrate 110 is removed. The etching process may include performing a wet etching process.

Figure 4:
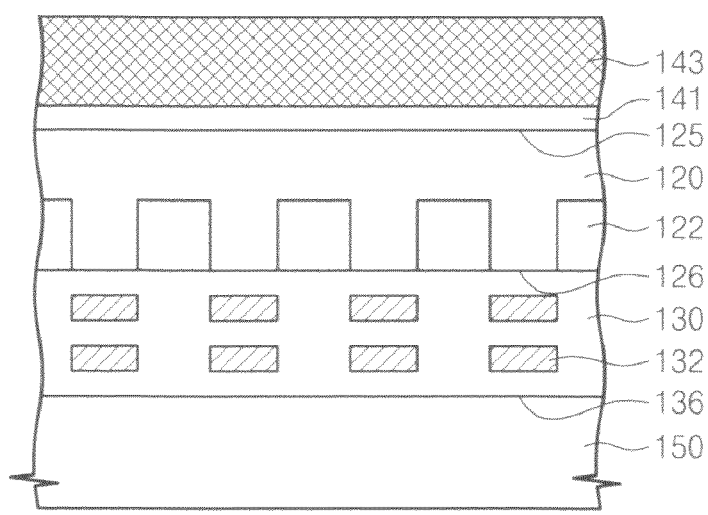

Referring to FIG. 4, a diffusion control layer 141 may be formed on the single crystalline semiconductor layer 120. The diffusion control layer 141 may be formed of different material from the single crystalline semiconductor layer 120. Alternatively, the diffusion control layer 141 may include a material having a different crystalline structure from the single crystalline semiconductor layer 120. For example, when the single crystalline semiconductor layer 120 is formed of a semiconductor element belong to the Group 4A, the diffusion control layer 141 may include an oxide of a semiconductor element belonging to Group 4A.

The diffusion control layer 141 may be formed by various methods, but in example embodiments, a method of forming the diffusion control layer 141 by an oxidation process is described. Forming the diffusion control layer 141 may include performing a wet oxidation on a semiconductor element of a surface of the single crystalline semiconductor layer 120. For example, an oxidation solution may be provided onto a surface of the single crystalline semiconductor layer 120 to oxidize a portion of the single crystalline semiconductor layer 120. More specifically, the diffusion control layer 141 may be formed by treating the single crystalline semiconductor layer 120 with a solution diluting at least one of hydrochloric acid, hydrogen peroxide and ammonia water with water. Alternatively, the diffusion control layer 141 may also be formed by providing a solution dissolving ozone in deionized water to the single crystalline semiconductor layer 120.

In example embodiments described above, the diffusion control layer 141 may be formed while consuming a portion of the single crystalline semiconductor layer 120. Thus, a surface defect formed on the single crystalline semiconductor layer 120 may be removed while forming the diffusion control layer 141. The surface defect of the single crystalline semiconductor layer 120 may occur during a formation of the substrate 110 described above. There may be various reasons causing the surface defect. For example, when the single crystalline semiconductor layer 120 is comprised of silicon, the surface defect may be caused by a dangling bonding of the silicon and an etching stress.

A dark current of an image sensor may occur by the surface defect. When a light is input through the single crystalline semiconductor layer 120, undesired holes or electrons may be generated in the single crystalline semiconductor layer 120 by the surface defect of the single crystalline semiconductor layer 120. Accordingly, a dark current may be generated in the single crystalline semiconductor layer 120. However, in example embodiments, when the diffusion control layer 141 is formed by an oxidation process, a large portion of the surface defect may be removed during a formation of the diffusion control layer 141. Thus, a dark current of an image sensor may be reduced.

A material layer including dopants 143 may be formed on the single crystalline semiconductor layer 120. When the diffusion control layer 141 is formed on the single crystalline semiconductor layer 120, the material layer including dopants 143 may be formed on the diffusion control layer 141.

The material layer including dopants 143 may include dopants of a first conductivity type. For example, the dopants of the first conductivity type may have the conductivity type identical to the dopants included in the single crystalline semiconductor layer 120. For example, the dopants of the first conductivity type may include boron (B). A concentration of the dopants of the material layer including dopants 143 may be higher than the concentration of the dopants of the single crystalline semiconductor layer 120.

The material layer including dopants 143 may include amorphous semiconductor material. For example, the material layer including dopants 143 may include Group 4A elements in amorphous state.

Figure 5:
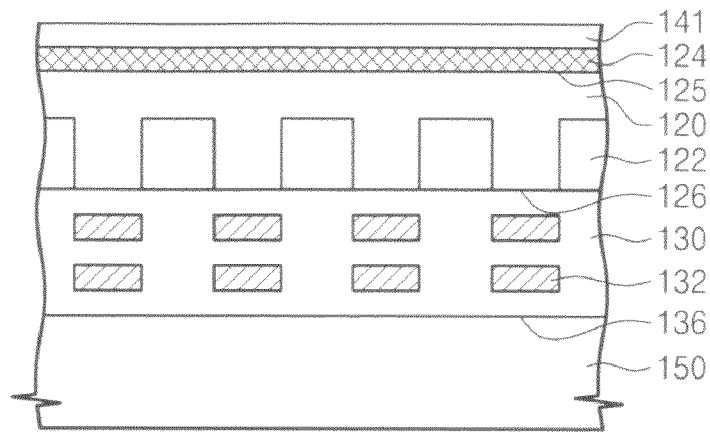

Referring to FIG. 5, an annealing process may be performed on the material layer 143 including the dopants. The annealing process may include irradiating a laser to the material layer 143 including the dopants. The laser may have a wavelength in a visible region.

A dopant diffusion layer 124 may be formed by moving of dopants of the material layer 143 to the single crystalline semiconductor layer 120. The moving of dopants may be caused by the annealing process. The dopant diffusion layer 124 may be formed in an upper portion of a back side direction of the single crystalline semiconductor layer 120. The dopant diffusion layer 124 may be spaced apart from the photodiode 122 by the single crystalline semiconductor layer 120. That is, most of the dopants may not be diffused as far as a region where the photodiode 122 is formed.

When the material layer including dopants 143 is in an amorphous state, the annealing process using a laser may be more efficiently performed. More specifically, when the material layer including dopants 143 includes silicon of an amorphous state, the material layer including dopants 143 may have a high extinction coefficient with respect to a laser. Thus, an absorbance of a laser with respect to the material layer including dopants 143 is improved, thereby efficiently performing the annealing process.

Additionally, according to example embodiments, when the dopant diffusion layer 124 is formed by a diffusion of the dopants of the material layer 143 including the dopants, defects that may occur in a direction of the first side 125 of the single crystalline semiconductor layer 120 may be more reduced. If dopants are implanted directly into the single crystalline semiconductor layer 120, and the single crystalline semiconductor layer 120 annealed, defects may occur in a backside of the single crystalline semiconductor layer 120 during a process of implanting dopants. Because a light provided externally is input from a direction of a back side of the single crystalline semiconductor layer 120, defects of the backside of the single crystalline semiconductor layer 120 may deteriorate a performance of an image sensor. However, according to example embodiments, defects of the single crystalline semiconductor layer 120 may be minimized or reduced because directly performing an ion implantation process on the single crystalline semiconductor layer 120 is not necessarily required. Thus, a dark current of an image sensor including the single crystalline semiconductor layer 120 and the dopant diffusion layer 124 may be reduced.

In addition, where the diffusion control layer 141 is further formed on the single crystalline semiconductor layer 120, a diffusion of the dopants may be controlled by the diffusion control layer 141. Thus, when the dopant diffusion layer 124 is formed, defects of the single crystalline semiconductor layer 120 may be more reduced. For one example, the diffusion control layer 141 may be formed of an oxide of the single crystalline semiconductor layer 120 and the material layer including dopants 143 may be formed of an amorphous silicon layer. The diffusion control layer 141, the single crystalline semiconductor layer 120 and the material layer including dopants 143 may have a different crystalline structure from each other. Accordingly, when the dopants move from the material layer 143 including the dopants, a moving velocity of the dopants may be reduced due to a difference of the crystalline structure. Thus, an occurrence of defects of the single crystalline semiconductor layer 120 due to a movement of the dopants may be reduced.

A concentration of the dopants of the dopant diffusion layer 124 may be higher than a concentration of the dopants of the single crystalline semiconductor layer 120. The concentrations of the dopants of the dopant diffusion layer 124 and the single crystalline semiconductor layer 120 may be controlled by controlling an annealing time, an annealing temperature and/or a laser wavelength.

Figure 6:
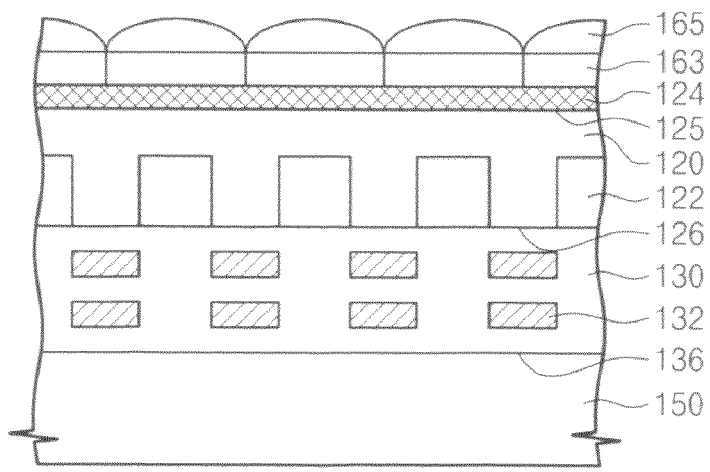
FIG. 6 is a drawing for illustrating a image sensor according to example embodiments.

Referring to FIG. 6, the diffusion control layer 141 may be removed. The diffusion control layer 141 may be removed by different methods based on the material. For example, if the diffusion control layer 141 includes a silicon oxide, the diffusion control layer 141 may be removed using a solution including hydrofluoric acid. The single crystalline semiconductor layer 120 may be exposed by a removal of the diffusion control layer 141.

A color filter 163 may be formed on the single crystalline semiconductor layer 120. One color filter 163 may be formed to correspond to one photodiode 122. The color filter 163 allows the light of a specific color penetrate, and transfers the light of a specific color to the photodiode 122. The color filter 163 may be formed of a dyed photoresist. Adjacent color filters 163 allow lights of different colors to penetrate. The color filter 163 may be formed by various processes including a process of dyeing, a process of dispersing paint and a process of printing.

A micro lens 165 may be formed on the color filter 163. The micro lens 165 may be formed to correspond to the photodiode 122 and/or the color filter 163. For example, one photo diode 122, one color filter 163 and one micro lens 165 make a pair with each other, thereby constituting one pixel.

The micro lens 165 may be formed by forming an insulating material layer which a light penetrates thereinto, and performing a reflow on the insulating material layer. The micro lens 165 may concentrate a light provided externally, and transfer the light to the color filter 163 and/or the photodiode 122. An insulating layer may be further formed between the micro lens 165 and the color filter 163. The insulating layer may include a light permeable polymer. For example, the insulating layer may include a polyimide system or a polyacrylic system.

Referring back to FIG. 6, an image sensor according to example embodiments is described. The insulating layer 130 including at least one interconnection line may be disposed on the support substrate 150. The insulating layer 130 may include a second side 136 adjacent to the support substrate 150 and a first side 126 which is opposite the second side 136.

The interconnection lines 132 and the insulating layer 130 132 may be formed to be a multilayer. In example embodiments, the interconnection lines 132 formed in the insulating layer 130 may be electrically connected to each other by a contact. The uppermost interconnection line 132 of the interconnection lines 132 may be covered with the insulating layer 130.

The single crystalline semiconductor layer 120 may be on the insulating layer 130. The single crystalline semiconductor layer 120 may include a semiconductor element of a single crystalline state. The single crystalline semiconductor layer 120 may include dopants of a first conductive type. The single crystalline semiconductor layer 120 may include the photodiode 122. The photodiode 122 may include a plurality of dopant regions having a different conductivity type from each other. For example, the photodiode 122 may include a first dopant region including a dopant of the first conductivity type and a second dopant region including a second conductivity type. A concentration of the dopants of the plurality of dopant regions constituting the photodiode 122 may be higher than a concentration of the dopants of the first conductivity type included in the single crystalline semiconductor layer 120.

A gate may be further provided on the single crystalline semiconductor layer 120. The gate may constitute a transistor with a portion of the dopant regions of the single crystalline semiconductor layer 120. The transistor may be one of transferring elements transferring an electric signal to the photodiode 122. Thus, the transistor and the photodiode 122 may be electrically connected to each other.

The dopant diffusion layer 124 may be located on the single crystalline semiconductor layer 120. The dopant diffusion layer 124 may be formed to be spaced apart from the photodiode 122 by the single crystalline semiconductor layer 120. The dopant diffusion layer 124 may include dopants of the first conductivity type. For example, the dopant diffusion layer 124 may include dopants having the conductivity type identical to the dopants included in the single crystalline semiconductor layer 120. In example embodiments, a concentration of dopants of the dopant diffusion layer 124 may be higher than a concentration of the dopants included the single crystalline semiconductor layer 120.

At least one color filter 163 may be disposed on the dopant diffusion layer 124. One color filter 163 may be formed to correspond to one photodiode 122. Adjacent color filters 163 may filter different colors from each other. The lens 165 may be disposed on the color filter 163. The lens 165 may concentrate a light from an external source to transfer the light to a photodetector including the photodiode 122. One lens 165 may correspond to one photodiode 122 and/or one color filter 163. One photo diode 122, one color filter 163 and one lens 165 make a pair with each other, thereby constituting one pixel.

According to example embodiments, a dopant diffusion layer may be formed by forming a material layer including dopants on a single crystalline semiconductor layer, and diffusing the dopants into the single crystalline semiconductor layer. Because the dopants are diffused in the single crystalline semiconductor layer, an occurrence of defects of the single crystalline semiconductor layer may be minimized or reduced during an implantation of dopants. Thus, an image sensor improving a phenomenon of a dark current due to a defect of the single crystalline semiconductor layer may be provided.

What is claimed is:

1. A method of forming an image sensor comprising:
providing a single crystalline semiconductor layer including at least one photodiode on a support substrate;
forming a material layer including dopants on the single crystalline semiconductor layer; and
forming a dopant diffusion layer in the single crystalline semiconductor layer by diffusing the dopants of the material layer.

2. The method of claim 1, further comprising:
an insulating layer on the support substrate; and
at least one interconnection line in the insulating layer, wherein the single crystalline semiconductor layer is on the insulating layer.

3. The method of claim 1, further comprising:
forming a diffusion control layer between the single crystalline semiconductor layer and the insulating layer.

4. The method of claim 3, wherein forming the diffusion control layer includes oxidizing a portion of the single crystalline semiconductor layer.

5. The method of claim 4, wherein oxidizing the portion of the single crystalline semiconductor layer includes performing a wet oxidation process.

6. The method of claim 5, wherein performing the wet oxidation process includes treating a surface of the single crystalline semiconductor layer with an oxidation solution to oxidize a portion of the single crystalline semiconductor layer.

7. The method of claim 6, wherein the oxidation solution is made of at least one of hydrochloric acid, hydrogen peroxide and ammonia water diluted with water.

8. The method of claim 6, wherein the oxidation solution is deionized water including ozone dissolved therein.

9. The method of claim 3, wherein the diffusion control layer is made of a different material from the single crystalline semiconductor layer or a material having a different crystalline structure from the single crystalline semiconductor layer.

10. The method of claim 3, further comprising:
removing the diffusion control layer in order to expose the single crystalline semiconductor layer;
forming at least one color filter on the single crystalline semiconductor layer; and
forming at least one micro lens on the at least one color filter.

11. The method of claim 10, wherein the at least one color filter corresponds with the at least one photodiode.

12. The method of claim 10, wherein the at least one color filter is formed of a dyed photoresist.

13. The method of claim 10, wherein the at least one micro lens, the at least one photo diode, and the at least one color filter constitute one pixel.

14. The method of claim 1, wherein diffusing the dopants includes irradiating a laser into the material layer.

15. The method of claim 1, wherein the material layer includes a semiconductor element of an amorphous state.

16. The method of claim 1, wherein the dopants are p-type.

17. The method of claim 1, wherein the single crystalline semiconductor layer is doped with dopants of a first conductivity type, the at least one photodiode is doped with dopants of a second conductivity type, and wherein a concentration of the dopants in the dopant diffusion layer is higher than a concentration of the dopants in the single crystalline semiconductor layer.

18. The method of claim 1, wherein the at least one photodiode is spaced apart from the dopant diffusion layer.

* * * * *